United States Patent
Wong et al.

[11] Patent Number: 5,949,716
[45] Date of Patent: Sep. 7, 1999

[54] LOOK-AHEAD ERASE FOR SEQUENTIAL DATA STORAGE

[75] Inventors: Sau C. Wong, Hillsborough; Hock C. So, Redwood City, both of Calif.

[73] Assignee: Invox Technology, Campbell, Calif.

[21] Appl. No.: 08/839,288

[22] Filed: Apr. 16, 1997

[51] Int. Cl.⁶ .................................................. G11C 16/04
[52] U.S. Cl. ........................... 365/185.29; 365/185.33; 365/185.24
[58] Field of Search ................... 365/189.04, 185.28, 365/185.29, 185.3, 185.33, 185.24, 185.01

[56] References Cited

U.S. PATENT DOCUMENTS

| | | | |
|---|---|---|---|
| 4,758,988 | 7/1988 | Kuo | 365/200 |
| 5,347,490 | 9/1994 | Terada et al. | 365/185.11 |
| 5,621,690 | 4/1997 | Jungroth et al. | 365/185.11 |

*Primary Examiner*—David Nelms
*Assistant Examiner*—David Lam
*Attorney, Agent, or Firm*—Skjerven, Morrill, MAcpherson, Franklin & Friel LLP; Alan H. MacPherson; David T. Millers

[57] ABSTRACT

Continuous recording in a flash memory uses a look-ahead erase process that includes simultaneously writing data to a first sector in a first array while preparing (erasing and/or partially programming) a second sector in a second array. The second sector is ready for writing when a last datum fills the first sector and is immediately available for writing while a third sector is prepared. The look-ahead erase keeps preparing sectors so that writing can continue without interruptions for erase processes. Embodiments of the invention include integrated circuit memories having two or more memory arrays, each having a plurality of independently erasable sectors. Each time a sector is filled the write process switches to a sector in another array.

19 Claims, 5 Drawing Sheets

LOOK-AHEAD ERASE FOR SEQUENTIAL DATA STORAGE

BACKGROUND

1. Field of the Invention

This invention relates to non-volatile semiconductor memory and particularly to circuits and methods for erasing and programming flash memory.

2. Description of Related Art

A conventional erasable non-volatile semiconductor memory cell includes a transistor, such as floating gate transistor, having a threshold voltage that can be changed to represent stored information. Typically, to write data in such memory cells, the memory cells are first erased to set the threshold voltage of the memory cells in an erased state, for example, a low (or a high) threshold voltage level, where the threshold voltage of the memory cells are known. Data are then written to the memory cells by programming selected cells.

Data may be written or stored in many forms. For example, data can be stored in a binary form with one bit per memory cell. Binary data storage leaves some memory cells in the erased state to represent a first bit value (zero or one) and programs the threshold voltage of other memory cells to a second state representing a second bit value (one or zero). Alternatively, data can be stored with multiple bits per memory cell by programming the threshold voltage of a memory cell to a level within a set of discrete states that represent the possible values that can be stored in the memory cell. Data can also be stored in an analog form with one analog value (or sample) per memory cell by programming the threshold voltage of each memory cell to a level within a continuous range of threshold voltages that is in one-to-one correspondence with the range of analog values being written.

Fowler-Nordhiem tunneling is a typical mechanism for an erase process in a conventional non-volatile memory such as an EEPROM, an EPROM, or a flash memory. Fowler-Nordhiem tunneling is a relatively slow process and thus reduces the write speed in memories that erase individual cells immediately before writing. Accordingly, flash memory, which simultaneously erases a block of memory cells, has been developed. However, erasing a block of memory cells in a flash memory may delay the start of writing data, and such delays can be a problem in a real time data recording system. For example, when a non-volatile memory records a continuous signal, part of the signal may be lost while an erase process prepares a block of memory cells for recording. A non-volatile semiconductor memory capable of immediately commencing and continuously maintaining data recording operations is sought.

SUMMARY

In accordance with the invention, a non-volatile memory simultaneously writes to a first memory sector while preparing (e.g. erasing and/or partially programming) a second memory sector for writing. The sectors have sizes selected so that the total time required to write to all the memory cells in the first sector is greater than or equal to the time required to erase the second sector. Thus, a recording operation can finish writing to the first block and start writing to the second block without delay for an erase operations. Data can be written in binary, multilevel digital, or analog form. Writing to the second sector is simultaneous with preparing a third sector that will be written to immediately after the second sector.

An exemplary embodiment of the invention is a monolithic integrated circuit memory that includes a row decoder located between the first and second arrays of memory cells. Each array is divided into a set of independently erasable sectors of memory cells. A look-ahead erase and recording process records data in a sector in one of the memory arrays while a sector in the second memory array is erased. The row decoder can be temporarily disconnected from the array containing the sector being erased while connected to the array containing the sector being written. The erase process may additionally include preprogramming or remedial programming to avoid overerase of memory cells. During preprogramming or remedial programming, the row decoder may be connected to both arrays so that the row decoder simultaneously selects a memory cell being written and memory cells being partially programmed to avoid overerasure.

In another embodiment of the invention, a look-ahead erase process, simultaneously writes to a first sector, erases a second sector, and partially programs a third sector to avoid an overerase. For a system using preprogramming to avoid an overerase, writing to the second sector, erasing the third sector, and preprogramming a fourth sector begin when writing to the first sector is finished. Preprogramming, erasing, and writing sectors continue in this fashion for continuous recording. A similar three-cycle look-ahead erase process writes a first sector, remedially programs a second sector, and erases a third sector. Embodiments of memories for the look-ahead erase with partial programming includes integrated circuit memories including two or more separate arrays, each containing multiple independently erasable memory sectors.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
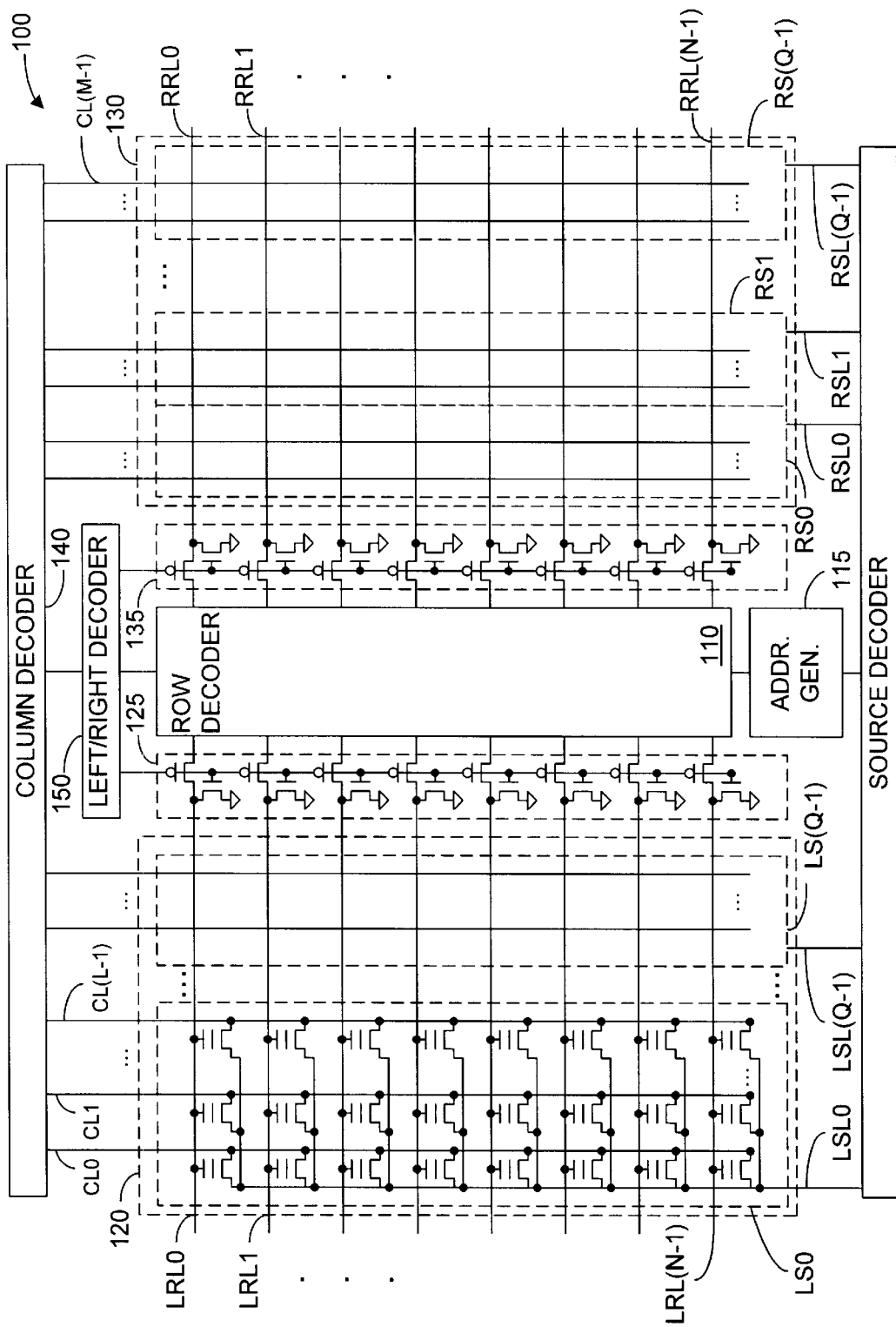
FIG. 1 illustrates an integrated circuit memory having two memory arrays for a recording process with a look-ahead erase in accordance with an embodiment of the invention.

FIG. 1 illustrates an integrated circuit memory 100 in accordance with an embodiment of the invention. Memory 100 includes a left memory array 120, a right memory array 130, a row decoder 110, a column decoder 140, a source decoder 160, and a left/right decoder 150. Left memory array 120 and right memory array 130 are on opposite sides of row decoder 110, and left/right decoder 150 controls whether array select transistors 125 and 135 connect row decoder 110 to left array 120, right array 130, or both. Row decoder 110, column decoder 140, and source decoder 160 apply the voltages necessary for erasing, writing, or reading selected memory cells in arrays 120 and 130.

In accordance with an aspect of the invention, memory 100 uses a look-ahead erase process when recording a continuous data stream such as from an analog voice or sound signal. For recording of a continuous analog signal, samples of the analog data signal are written in arrays 120 and 130, one analog sample per memory cell, at a rate determined by a sampling frequency, typically about 4 to 8 kHz. To maintain continuous recording without delay or interruption for an erase, data are written to a first sector at the same time a second sector is erased. The erase time for the second sector is less than or equal to the quotient of the number of memory cells in the first sector and the sampling frequency so that when writing fills the first sector, the second sector is ready for writing data.

As illustrated in FIG. 1, each of memory arrays 120 and 130 contains N rows and M/2 columns of non-volatile semiconductor memory cells which may be, for example, floating gate transistors, split-gate transistors, or multi-transistor memory cells; and arrays 120 and 130 are each partitioned into Q independently erasable sectors LS0 to LS(Q-1) and RS0 to RS(Q-1). Each sector contains L columns of memory cells. In an exemplary embodiment of the invention, memory 100 contains 128,000 analog memory cells with each memory array 120 and 130 containing 64,000 memory cells in 100 rows and 640 columns that are partitioned into 80 sectors of 8 columns each. For simplicity of illustration, FIG. 1 shows some of the memory cells in sector LS0 only, and the memory cells shown are floating gate transistors. Alternative memory cell structures could be used.

Sectors LS0 to LS(Q-1) and RS0 to RS(Q-1) have associated sources lines LSL0 to LSL(Q-1) and RSL0 to RSL(Q-1), respectively, and each source line is coupled to all of the sources of the memory cells in the associated sector. Source decoder 160 controls the voltages on source lines LSL0 to LSL(Q-1) and RSL0 to RSL(Q-1) as required to erase, program, and read memory cells. Each memory cell in arrays 120 and 130 has a drain coupled to column decoder 140 via an associated one of M column lines CL0 to CL(M-1). (The terms drain and source as used herein distinguish terminals of a memory cell that are coupled to column decoder 140 and source decoder 160, respectively. Either terminal may function as a source or a drain depending on the applied voltages.) For binary memory, column lines CL0 to CL(M-1) are often referred to as bit lines since one bit at a time is written or read per line. Embodiments of the invention, however, include binary, multi-level, and analog memories where a bit, a multi-level value, and an analog value, respectively, are written or read via each column line.

Each memory cell in left memory array 120 has a control gate coupled to the one of left row lines LRL0 to LRL(N-1) that is associated with the memory cell, and each memory cell in right memory array 130 has a control gate coupled to the one of right row lines RRL0 to RRL(N-1) that is associated with the memory cell. Array select transistors 125 and 135 are between row decoder 110 and row lines LRL0 to LRL(N-1) and RRL0 to RRL(N-1), respectively, and decoder 150 controls which set of row lines LRL0 to LRL(N-1) or RRL0 to RRL(N-1) are connected to row decoder 110.

For a look-ahead erase process, decoder 150 alternates between connecting array 120 to row decoder 110 while disconnecting array 130 from row decoder 110 and connecting array 130 to row decoder 110 while disconnecting array 120 from row decoder 110. A sector in the disconnected array 120 or 130 is erased while data are written to memory cells in a sector in the connected array 130 or 120. In the exemplary embodiment, a sector is erased by electron tunneling caused by applying a high voltage (about 12 volts) to source line of the sector, grounding the row lines in the array containing the sector, and allowing column lines in the sector to float.

Source decoder 160, column decoder 140, left/right decoder 150, and transistors 125 and 135 control the erase of a sector. Source decoder 160 contains a decoder tree and driver circuits that select a source line and apply an erase voltage Vse (about 12 volts) to the selected source line while grounding the source lines for all other sectors. Left/right decoder 150 and transistors 125 or 135 disconnect row decoder 110 from the array 120 or 130 containing the sector being erased and ground all of the row lines in the disconnected array. Column decoder 140 can be a conventional column decoder that causes all of column lines CL0 to CL(M-1) to float except for a column line selected for a write or read operation. Column decoder 140 applies either a read voltage Vcr or a program voltage Vcp to the selected column line.

While erasing a sector in the disconnected array 120 or 130, data values can be written to memory cells in a sector within the array 130 or 120 connected to row decoder 110. In the exemplary embodiment, a data value is written to a selected memory cell by channel hot electron injection caused by applying programming voltage Vcp (typically about 6 volts) to the column line coupled to the selected memory cell, grounding the source line of the sector containing the selected memory cell, and applying a programming voltage Vrp to the row line coupled to the selected memory cell.

Column decoder 140 applies programming voltage Vcp to the selected column line during a write and allows the unselected column lines to float, and source decoder 160 grounds all of the source lines LSL0 to LSL(Q-1) and RSL0 to RSL(Q-1) except the source line of the sector being erased. Row decoder 110 applies a programming voltage Vrp to the row line connected to the select memory cell in the connected array. Since row decoder 110 is not connected to the array 120 or 130 containing the sector being erased, programming voltage Vrp does not interfere with the erase operation.

In the exemplary embodiment of the invention, an analog sample is written to a memory cell by asserting programming voltages Vrp and Vcp in a series of write pulses on the selected row and column lines. Each pulse increases the threshold voltage of the selected memory cell. Voltage Vrp preferably depends on value of the analog sample but may be a fixed voltage independent of the analog sample being written. For example, the range of possible analog samples can be mapped to a voltage range between 8 and 12 volts for program voltage Vrp. Between at least some of the programming pulses are verify cycles in which the threshold voltage of the selected memory cell is compared to a desired level for the analog sample being written. During an exemplary verify cycle, column decoder 140 applies to the selected column read voltage Vcr, and row decoder 110 applies to the selected row line a verify voltage Vrv that is derived from the value being written. A memory cell not conducting during a verify cycle indicates that the memory cell has reached the desired level. During an alternative verify cycle, the selected memory cell is read, and the value read is compared to the value being written. The write operation is complete and the write pulses are stopped when a verify cycle indicates the desired level has been reached.

The continuous write operation with look-ahead erase proceeds in ping-pong fashion, first writing to a sector in array 120 while erasing a sector in array 130 and then writing to the erased sector in array 130 while erasing a sector in array 120. An initialization or start-up process for memory 100 can erase a single sector in array 120 or 130 to prepare memory 100 to immediately start and maintain continuous recording. The look-ahead erase process has several advantages over possible alternatives. For example, an alternative process that must erase the entire memory before beginning a recording operation can erase all of the sectors simultaneously which requires larger charge pumps and increases integrated circuit cost or can erase sectors in series which requires much more time. Additionally, the alternative erase processes must be repeated after filling the memory making a small or large delay reoccur. A look-ahead erase process eliminates these delays.

Another continuous recording process with a look-ahead erase provides either preprogramming or remedial programming of a sector being erased. Partial programming is used herein to refer generically to both preprogramming and remedial programming. Partial programming raises the threshold voltage of memory cells before or after an erase operation. This reduces the chance of a memory cell being overerased by repeated erase processes with or without intervening writes.

For partial programming in memory 100, row decoder 110 is connected to both arrays 120 or 130 during part of the time during which data are written, and memory cells in two sectors, the sector to which data are being written and the sector being erased, are simultaneously programmed. For one embodiment of this process, data are written (or recorded) column-by-column so that a column address that identifies a selected column for programming only changes when data values have been written to every cell in the column. For example, an on-chip address generator 115 can sequentially increment a row address that identifies the selected row until reaching the last row in a column while the column address remains constant. Accordingly, the row address runs through the range of possible values for each column address. Upon reaching the last row address, address generator 115 resets the row address and increments the column address unless the column address is the last for a sector. If the column address is the last for a sector, address generator 115 changes the column address to select the first column of a sector in the other array.

For an exemplary write process with look-ahead erase and preprogramming, data values are written to left sector LS0 while right sector RS0 is preprogrammed and then erased. The preprogramming is simultaneous with writing data to the first column of sector LS0 (i.e. to memory cells coupled to column line CL0.) While data are written to the first column of sector LS0, source decoder 160 grounds all source lines LSL0 to LSL(Q-1) and RSL0 to RSL(Q-1), and column decoder 140 applies the programming voltage Vcp to column line CL0 and all column lines in sector RS0. Accordingly, in the exemplary embodiment, a charge pump or external source that generates programming voltage Vcp must provide sufficient current to simultaneously program L (or L+1) memory cells.

For preprogramming, decoder 150 and transistors 125 and 135 connect decoder 110 to both left row lines LRL0 to LRL(N-1) and right row lines RRL0 to RRL(N-1). For example, row decoder 110 selects programming voltages for both row lines LRL0 and RRL0 when a first data value is written in sector LS0 and memory cells in the first row of sector RS0 are preprogrammed. In alternative embodiments a preprogramming voltage Vrpp for the sector being erased may be the same as or different from programming voltage Vrp. For example, preprogramming voltage Vrpp can be fixed at a relatively low level for programming (e.g. about 8 volts) while the programming voltage Vrp depends on the value being written. As the row address is sequentially incremented for writing to the first column in sector LS0, memory cells in corresponding rows in sector RS0 are preprogrammed.

When the column address changes to identify column line CL1, decoder 150 and transistors 135 disconnect and ground right row lines RRL0 to RRL(N-1) while row decoder 110 remains connected through transistors 125 to left row lines LRL0 to LRL(N-1). Source decoder 160 applies erase voltage Vse to source line RSL0 to erase sector RS0 while data are written to memory cells coupled to column lines CL1 to CL(L-1). The look-ahead erase continues in a similar fashion by writing to sector RS0 in right array 130 while preprogramming and then erasing a sector LS1 in left array 120.

Figure 2:
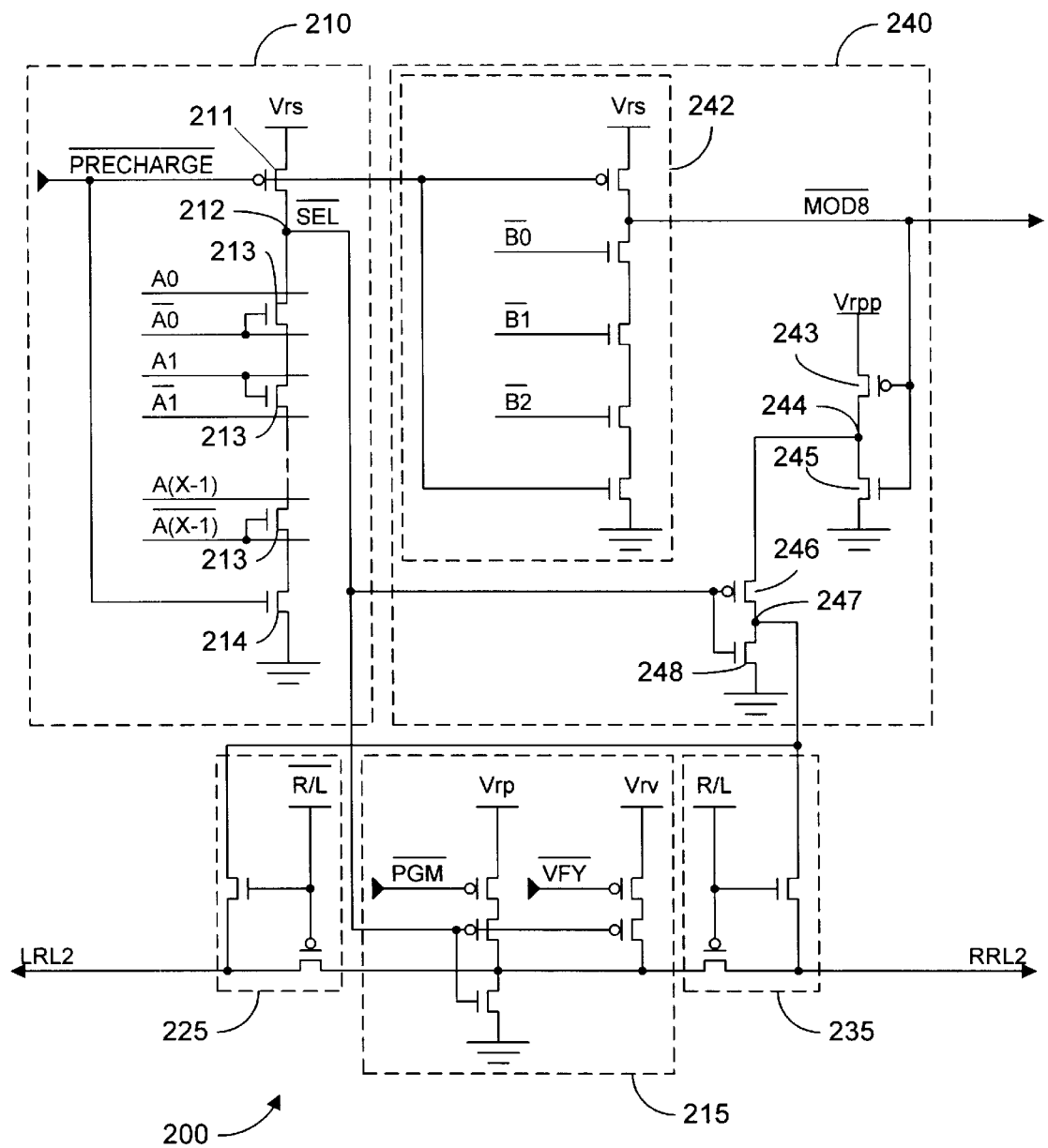
FIG. 2 shows decode circuitry for a look-ahead erase process with preprogramming.

FIG. 2 shows decode circuitry 200 for a pair of row lines LRL2 and RRL2 in a memory using a look-ahead erase process with preprogramming. Decode circuitry 200 includes a decoder tree 210 which selects a row line for programming, a row line driver 215 for write operations, a row line driver 240 for erase operations, array select transistors 225 that connect row line LRL2 to driver 215 or 240, and array select transistors 235 that connect row line RRL2 to driver 240 or 215.

Decoder tree 210 generates a select signal $\overline{SEL}$ which is asserted low to indicate row line LRL2 or RRL2 is coupled to a memory cell being accessed (written or read). Decoder tree 210 contains transistors 211, 213, and 214 which are connected in series between a voltage Vrs and ground, and signal $\overline{SEL}$ is taken from a node 212 between transistors 211 and 213. In operation, a signal $\overline{PRECHARGE}$ is asserted low to the gates of transistors 211 and 214 which turns on p-channel transistor 211, turns off n-channel transistor 214, and charges node 212 to voltage Vrs. A charge pump or other high voltage source (not shown) supplies voltage Vrs at a level greater than or equal to the maximum of programming voltage Vrp and preprogramming voltage Vrpp. Row address signals A0 to AX and $\overline{A0}$ to $\overline{AX}$ are applied to decoder tree 210 during precharge which charges a conducting string of transistors 213 connected to node 212.

When signal $\overline{PRECHARGE}$ goes high, transistor 211 is turned off, and transistor 214 is turned on. Signal $\overline{SEL}$ remains high unless transistors 213 all conduct and pull signal $\overline{SEL}$ low. Transistors 213 have gates coupled to a combination of row address signals A0 to AX and their compliments $\overline{A0}$ to $\overline{AX}$ as required so that signal $\overline{SEL}$ is only asserted when the row address selects the second row in the array. Row decoder 110 contains N similar decoder trees, one for each pair of row lines LRLi and RRLi in arrays 120 and 130. Each of the decoder trees is coupled to a unique combination of row address signals A0 to AX and their compliments $\overline{A0}$ to $\overline{AX}$ so that in row decoder 110, only one decoder tree at a time asserts a select signal.

During programming of a selected memory cell coupled to row line LRL2 or RRL2, decoder tree 210 asserts select signal $\overline{SEL}$ which causes driver 215 to apply programming voltages to row line LRL2 or RRL2. Array select transistors 225 or 235 connect row line driver 215 to row line LRL2 or RRL2 depending on a signal R/L that indicates whether the memory cell selected for programming is in right array 130. Decoder 150 generates signal R/L by decoding column address signals B0 to B(Y-1) to determine which array 120 or 130 contains the selected memory cell. In the embodiment of FIG. 2, row line driver 215 alternately applies programming voltage Vrp and a verify voltage Vrv to the word line of the selected array to implement a pulsed write process as described above.

If the selected memory cell is not coupled to row line LRL2 or RRL2, signal $\overline{SEL}$ is not asserted, and driver 215 grounds the row line LRL2 or RRL2 coupled to row decoder 110 through transistors 225 or 235.

Driver 240 grounds the row line LRL2 or RRL2 that is not in the same array as the selected memory cell unless that row line LRL2 or RRL2 is associated with the row containing the selected memory cell, i.e. signal $\overline{SEL}$ is asserted (low), and the look-ahead erase is currently preprogramming the sector to be erased. A decoder tree 242 decodes column address signals and generates a signal $\overline{MOD8}$ to control when preprogramming voltage Vrpp is applied. In the exemplary embodiment of the invention, preprogramming of a sector occurs while writing data to a first column of another sector. The exemplary embodiment of the invention uses eight columns of memory cells per sector, and the least significant bits of the column addresses are all zero (i.e. signals $\overline{B0}$, $\overline{B1}$, and $\overline{B2}$ are all high) when writing to the first column of a sector. Decoder 242 pulls signal $\overline{MOD8}$ low when writing to the first column of any sector.

Signal $\overline{MOD8}$ is applied to the gate of a p-channel transistor 243 coupled between voltage Vrpp and a node 244 and to the gate of an n-channel transistor 245 between node 244 and ground. If signal $\overline{MOD8}$ is low, the voltage at node 244 is about equal to preprogramming voltage Vrpp. Otherwise, transistor 225 grounds node 244. Signal $\overline{MOD8}$ when high is at voltage Vrs which is higher than preprogramming voltage Vrpp to shuts off p-channel transistor 243.

Decoder tree 242 and transistors 243 and 245 may be implemented as part of left/right decoder 150 so that one decoder tree 242 and voltage select circuit for preprogramming is provided for the entire memory rather than repeating the same circuitry for each pair of row lines LRLi and RRLi. Signal $\overline{MOD8}$ can also be applied to source decoder 160 and column decoder 140 to cause source decoder 160 to ground all source lines LSL0 to LSL(Q-1) and RSL0 to RSL(Q-1) and select a mode where column decoder applies the programming voltage Vcp to the column lines in the sector to be erased in addition to the column line selected for a write operation.

Select signal $\overline{SEL}$ is applied to the gate of a p-channel transistor 246 which is between node 244 and a node 247 and to the gate of an n-channel transistor 248 which is between node 247 and ground. When signal $\overline{SEL}$ is asserted (low), the voltage at node 247 is about equal to the voltage at node 244 so that the voltage at node 247 is equal preprogramming voltage Vrpp when row line LRL2 or RRL2 is selected and the first column of a sector is being written. Otherwise, node 247 is grounded through transistor 245 or 248. Select transistors 225 apply the voltage from node 247 to row line LRL2 when signal R/L indicates array 130 contains the selected memory cell. Select transistors 235 apply the voltage from node 247 to row line RRL2 when signal R/L indicates array 120 contains the selected memory cell. CMOS pass gates may be used in select transistors 225 and 235 to transfer the voltage from node 247 without a voltage drop for the threshold voltages of n-channel transistors shown in FIG. 2.

Changing decoder tree 242 slightly could provide decode circuitry for a memory that performs remedial programming with a look-ahead erase. For example, if column address signals B0, B1, and B2 are applied to decoder 242 in place of complimentary signals $\overline{B0}$, $\overline{B1}$, and $\overline{B2}$, decoder 242 would assert signal $\overline{MOD8}$ (low) when the column address has all three least significant bits set to one, which only occurs for the last column in a sector. Thus, with this change in the exemplary embodiment, a sector is erased while writing to the first seven columns in another sector, and remedial programming with row line voltage equal to voltage Vrpp is performed while the last column in the other sector is written.

Another alternative record and look-ahead erase process in accordance with the invention uses three sectors. A first sector is preprogrammed or remedially programmed and a second sector is erased while data are written to a third sector. For example, in the embodiment of FIG. 1, a lookahead erase process can simultaneously preprogram a sector LS1 in array 120, erase a sector RS0 in array 130, and write to a sector LS0 in array 120. Once writing fills sector LS0 with data, the recording process begins writing to sector RS0, erasing sector LS1, and preprogramming sector RS1. The recording with look-ahead erase and preprogramming proceeds with two sectors in one are being written and preprogrammed in parallel. Preprogramming in this fashion writes a data value twice once for storage and a second time for preprogramming. However, simultaneous preprogramming and writing in the same array may reduce the efficiency or accuracy of the write operation.

Figure 3:
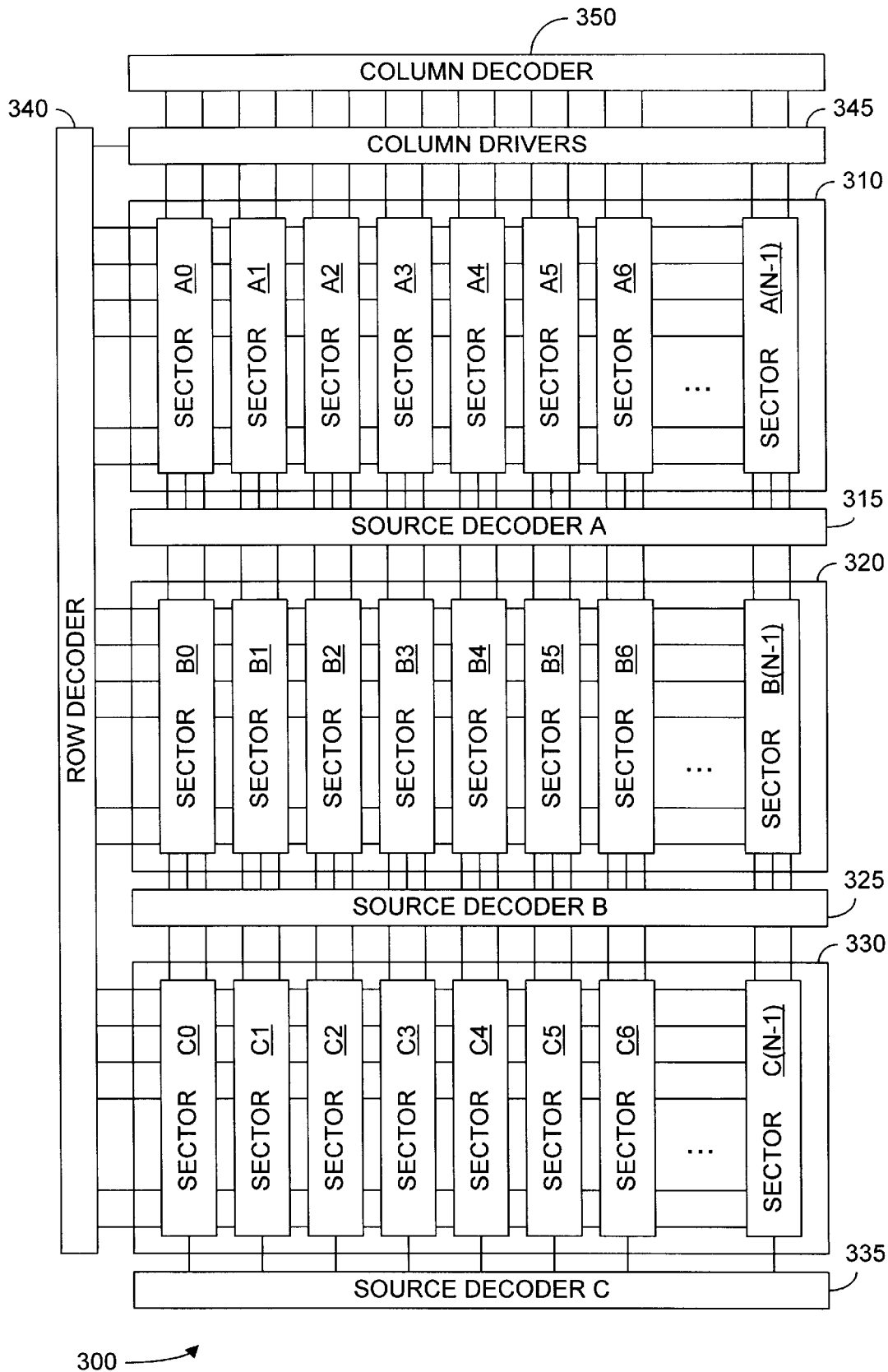
FIG. 3 illustrates a memory with three memory arrays for a recording process with a look-ahead erase and partial programming in accordance with an embodiment of the invention.
Figure 5:
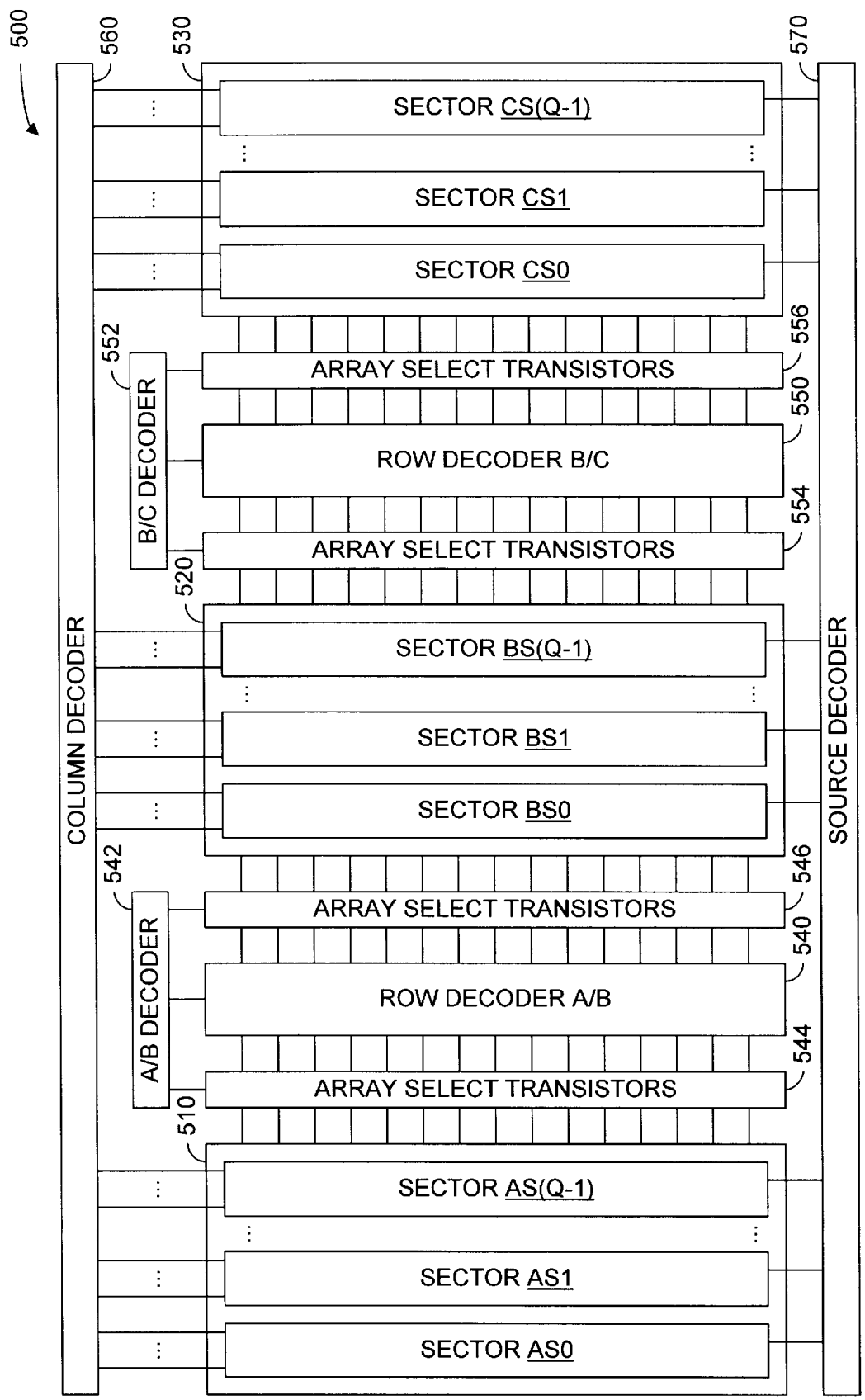
FIG. 5 illustrates another memory with three arrays for a recording process with a look-ahead erase and partial programming in accordance with an embodiment of the invention.

FIGS. 3 and 5 illustrate alternative structures for a three sector record and look-ahead erase process. A memory 300 of FIG. 3 has three separate arrays 310, 320, and 330 that share continuous column lines but correspond to different row addresses. Arrays 310, 320, 330 are partitioned into independently erasable sectors A0 to A(N-1), B0 to B(N-1), and C0 to C(N-1), respectively, and source decoders 315, 325, and 335 ground the source lines of every sector except a sector being erased.

Figure 4A:
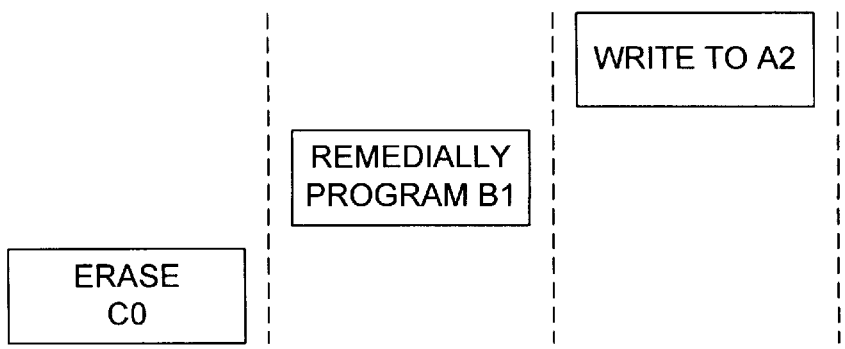
FIGS. 4A, 4B, 4C, and 4D illustrate the order in which erasable sectors are written, erased, and partially programmed for a look-ahead erase process suitable for the memory of FIG. 3.
Figure 4B:
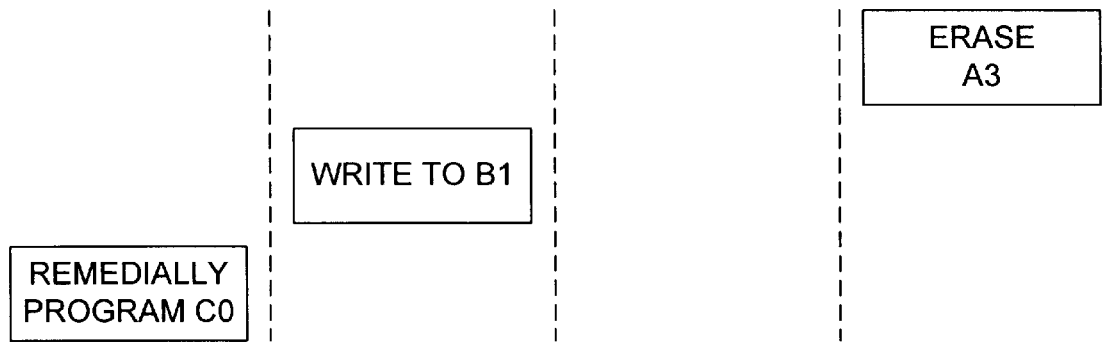
Figure 4C:
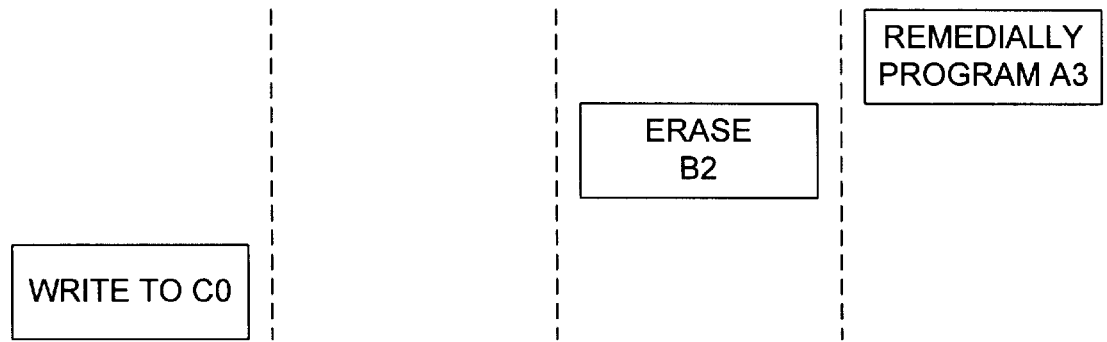
Figure 4D:
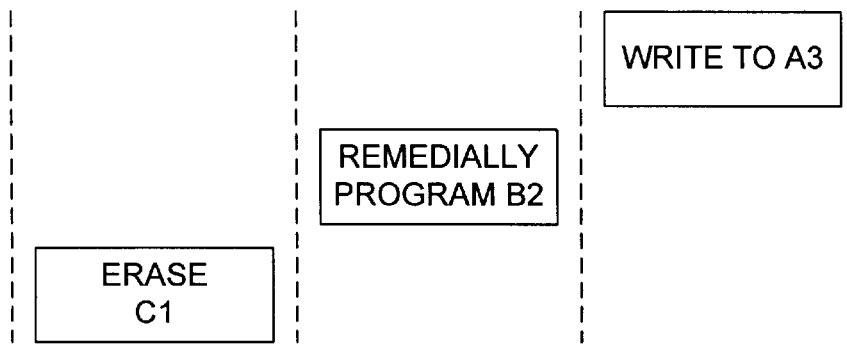

In operation, each of arrays 310, 320, and 330 contains an active sector that is being erased, written to, or preprogrammed or remedially programmed. The active sector are staggered relative to each other to avoid the programming voltage applied to a column line from affecting the sector being erased. FIGS. 4A, 4B, 4C, and 4D illustrate part of a continuous recording process with look-ahead erase and remedial programming. In FIG. 4A, the process simultaneously writes to sector A2 in array 310, remedially programs sector B1 in array 320, and erases sector C0. When sector A2 is full, the process, as shown in FIG. 4B, writes to sector B1, remedially programs sector C0, and erases sector A3. When sector B1 is full, the process, as shown in FIG. 4C, writes to sector C0, remedially programs sector A3, and erases sector B2. When sector C0 is full, the process, as shown in FIG. 4D, writes to sector A3, remedially programs sector B2, and erases sector C1. The relative positions of sectors C1, B2, and A3 as in FIG. 4D are the same as the relative positions of sectors C0, B1, and A2 as shown in FIG. 4A. The continuous recording process can continue from simultaneous operations illustrated in FIG. 4D in the fashion illustrated in FIGS. 4B and 4C.

To implement the recording process of FIGS. 4A to 4D, memory 300 applies programming voltage Vcp to two lines simultaneously, a first column line to which the memory cell selected for the write is coupled and a second column line which is in the sector being remedially programmed. The offset between the first and second column lines depends upon which of the arrays is being written. Other than edge effects for the last sectors in an array, when writing to array 310 or 320, the offset is the number of columns in a sector and toward lower column addresses; and when writing to array 330, the offset is twice the number of columns in a sector and toward higher column addresses. In the embodiment of FIG. 3, column decoder 350 selects three of column drivers 345, one corresponding to the column address and two corresponding to possible offsets from the column address. A signal from row decoder 340 identifying the array 310, 320, or 330 containing the memory cell being programmed, disables the column driver associated with the incorrect offset.

Row decoder 340 selects and applies the programming voltage Vrp to the row coupled to the selected memory cell and applies the preprogramming voltage Vrpp to a row line for the array containing the sector being remedially programmed. Again an offset from the selected row to the remedially programmed row depends on the array containing the memory cell being written. If a sector in array 310 is being written, row decoder 340 applies voltage Vrpp to the corresponding row line in array 320. If a sector in array 320 is being written, row decoder 340 applies voltage Vrpp to the corresponding row line in array 330. If a sector in array 330 is being written, row decoder 340 applies voltage Vrpp to the corresponding row line in array 310.

A memory architecture having only two arrays similar to those of FIG. 3 is sufficient for a look-ahead erase processes without remedial or preprogramming. Such recording processes with look-ahead erase switches between a state where a sector in the upper array is being written while a sector in the lower array is being erased and a state where a sector in the lower array is being written while a sector in the upper array is being erased.

FIG. 5 shows a memory 500 having another architecture capable of a continuous recording process with a look-ahead erase and partial programming. To control simultaneous write, erase, and partial program operations in three arrays, memory 500 includes two row decoders 540 and 550 which are similar or identical to row decoder 110 of FIG. 1. Row decoder 540 is between arrays 510 and 520, and a decoder 542 and array select transistors 544 and 546 control whether row decoder 540 is coupled to either or both of arrays 510 and 520. Row decoder 550 is between arrays 520 and 530, and a decoder 552 and array select transistors 554 and 556 control whether row decoder 550 is coupled to either or both of arrays 520 and 530.

In an exemplary continuous recording process for memory 500, each array contains an active sector that is being written to, erased, or partly programmed. For example, memory 500 can simultaneously write to a sector AS0 in array 510, remedially program a sector BS0 in array 520, and erase a sector CS0 in array 530. When sector AS0 is full, memory 500 writes to sector BS0, remedially programs sector CS0, and erases a sector AS1. Whenever writing has completely filled a sector, the continuous recording process continues by writing to the sector just remedially programmed, remedially programming the sector just erased, and erasing the sector following the sector just filled.

Decoders 554 and 552 and array select transistors 544, 546, 554, and 556 select which of arrays 510, 520, and 530 are connected to row decoders 540 and 550. If sectors in arrays 310 and 320 are being written and partially programmed, row decoder 540 is connected to both arrays 510 and 520 and row decoder 550 is disconnected from both arrays 520 and 530. If sectors in arrays 310 and 330 are being written or partially programmed, row decoder 540 is connected to array 510, row decoder 550 is connected to arrays 530, and array 520 is disconnected from both decoders 540 and 550. If sectors in arrays 320 and 330 are being written or partly programmed, row decoder 550 is coupled to both arrays 520 and 530 and row decoder 540 is disconnected from both arrays 510 and 520.

Although the invention has been described with reference to particular embodiments, the description is only an example of the invention's application and should not be taken as a limitation. Various adaptations and combinations of features of the embodiments disclosed are within the scope of the invention as defined by the following claims.

We claim:

1. A process for continuously recording data in a memory, comprising:

writing data to a first sector of the memory;

changing threshold voltages of memory cells in a second sector of the memory, wherein changing the threshold voltages prepares the second sector for writing of data and is simultaneous with writing data to the first sector; and writing data to the second sector after the second sector is prepared.

2. The process of claim 1, wherein changing the threshold voltages comprises erasing the second sector while writing data to the first sector.

3. The process of claim 2, wherein erasing the second sector is performed while data are being written to a first part of the first sector, and changing the threshold voltages further comprises partially programming the memory cells in the second sector while data are being written to a second part of the first sector.

4. The process of claim 3, wherein partially programming comprises preprogramming that is performed before the erasing of the second sector.

5. The process of claim 3, wherein partially programming comprises remedial programming that is performed after the erasing of the second sector.

6. The process of claim 1, wherein changing the threshold voltages comprises remedially programming the second sector after a previous erase operation, the process further comprising erasing a third sector simultaneously with writing data to the first sector and remedially programming the second sector.

7. The process of claim 6, further comprising remedially programming the third sector while writing data to the second sector.

8. The process of claim 1, wherein the first sector is in a first memory array and the second sector in a second memory array.

9. The process of claim 8, wherein:

the first memory array and second memory arrays are on opposite sides of a row decoder;

writing to the first sector comprises connecting the row decoder to the first array so that the row decoder applies a programming voltage to a row line in the first sector; and changing the threshold voltages comprises disconnecting the second array from the row decoder and grounding row lines in the second array.

10. The process of claim 9, wherein writing to the second sector comprises connecting the row decoder to the second array so that the row decoder applies a programming voltage to a row line in the second sector.

11. A process for continuously recording data in an integrated circuit memory that includes a first array of memory cells and a second array of memory cells, comprising:

writing data to memory cells in a sector of the first array;

changing threshold voltages of memory cells in a sector of a second array, wherein changing the threshold voltages prepares the memory cells for writing of data and is simultaneous with writing data to the first array;

writing data to the sector in the second array after the sector of the second array is prepared; and changing threshold voltages of memory cells in another sector of the first array, wherein changing the threshold voltages prepares the memory cells for writing of data and is simultaneous with writing data to the sector in the second array.

12. The process of claim 11, further comprising repeating the steps of claim 11 until recording of data is complete.

13. The method of claim 11, further comprising:

connecting a row decoder to the first array and disconnecting the row decoder from the second array while writing data in the first array and changing the threshold voltage of memory cells in the second array; and connecting the row decoder to the second array and disconnecting the row decoder from the first array while writing data in the second array and changing the threshold voltage of memory cells in the first array.

14. An integrated memory circuit comprising:

a first array of memory cells;

a second array of memory cells;

a row decoder disposed between the first array and the second array;

selection logic capable of selectable connecting the row decoder to the first array and the second array, wherein in response to a column address identifying a column line coupled to a selected memory cell, the selection logic connects the row decoder to a one of the first and second arrays that contains the selected memory cell and grounds row lines in a one of the first and second arrays that does not contain the selected memory cell; and a source decoder adapted to apply a voltage to erase memory cells in the one of the first and second arrays not containing the selected memory cell.

15. The memory of claim 14, wherein each of the first and second arrays comprises a plurality of independently erasable sectors of memory cells.

16. The memory of claim 15, wherein each sector comprises a plurality of columns of memory cells.

17. The memory of claim 16, further comprising an address generator coupled to the row decoder, the address generator changing a column address only after progressively changing a row address so that a series of row addresses identifies every row of memory.

18. The memory of claim 17, wherein:

upon reaching a last column address in a sector in the first array, the address generator changes the column address from identifying a column in the first array to a column address identifying a column in the second array; and upon reaching a last column address in a sector in the second array, the address generator changes the column address from identifying a column in the second array to a column address identifying a column in the first array.

19. The memory array of claim 14, wherein when the selection logic connects the row decoder to the one of the first and second arrays containing the selected memory cell, the row decoder applies a voltage for programming the selected memory cell while the source decoder applies the voltage to erase memory cells in the one of the first and second arrays not containing the selected memory cell.

* * * * *